June 24, 1969 J. J. KENNEDY 3,452,292
VARIABLE GAIN DIFFERENTIAL DIRECT CURRENT AMPLIFIER
Filed Feb. 5, 1965
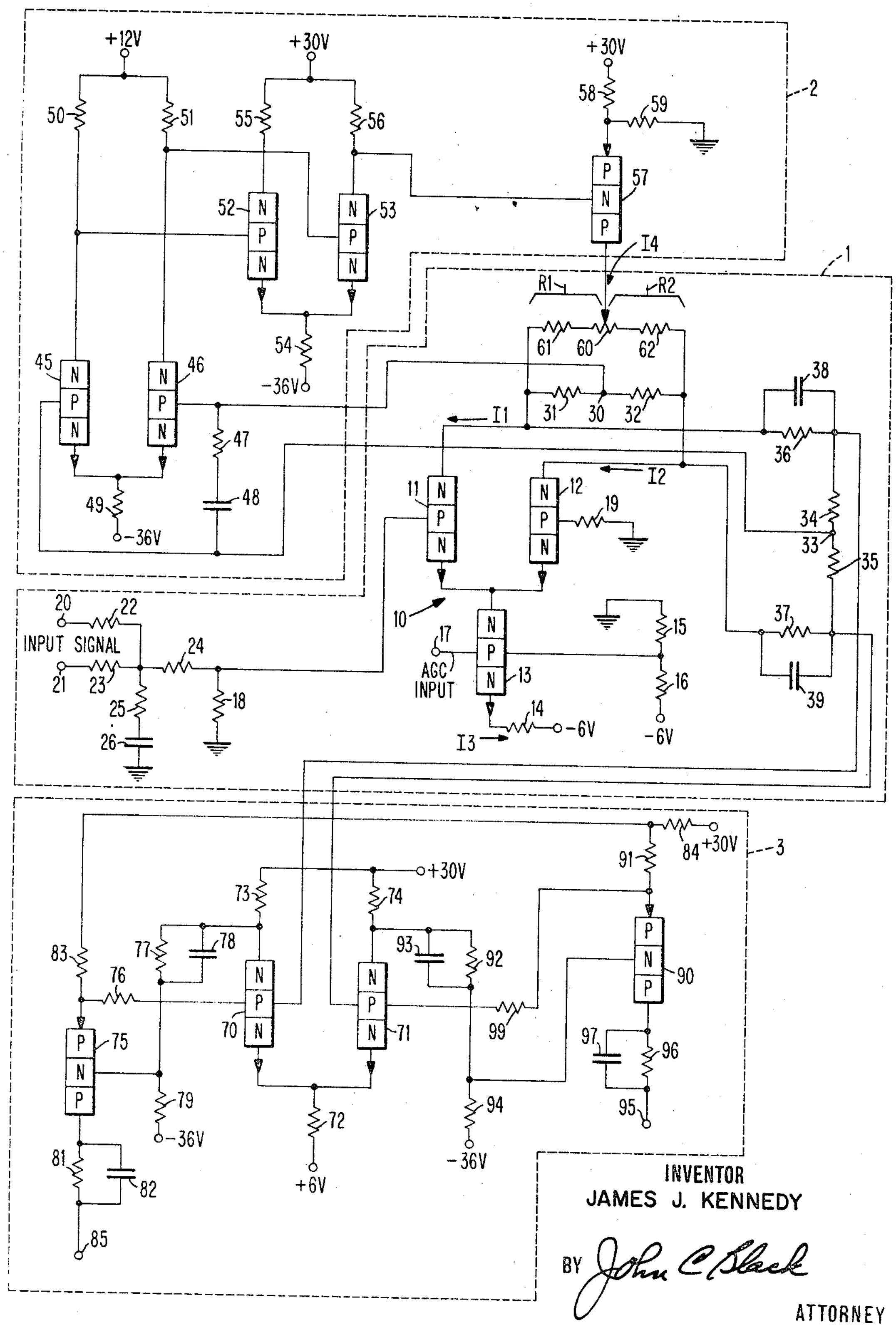
INVENTOR
JAMES J. KENNEDY
BY John C Black
ATTORNEY United States Patent Office 3,452,292

Patented June 24, 1969

3,452,292

VARIABLE GAIN DIFFERENTIAL DIRECT CURRENT AMPLIFIER

James J. Kennedy, Endicott, N.Y., assignor to International Business Machines Corporation, New York, N.Y., a corporation of New York Filed Feb. 5, 1965, Ser. No. 430,705
Int. Cl. H03f 3/68, 21/00
U.S. Cl. 330—30 3 Claims

ABSTRACT OF THE DISCLOSURE

This application relates to improvements in variable gain differential direct current amplifiers.

A pair of transistors connected as a differential amplifier have their emitter electrodes connected to a first transistor current source and their collector electrodes separately connected to a second transistor current source by respective resistors having a ratio inversely proportional to the respective collector currents flowing therethrough. The differential amplifier gain is varied by varying the current level of the first transistor current source. Second amplifier means causes the second transistor current source to produce current levels which maintain the ratio of the collector currents constant with variations in the differential amplifier gain. A pair of equal valued resistors couple the collector electrodes to output terminals. The second amplifier means is coupled to both sides of the equal valued resistors and is effective to reduce common mode current flow through the resistors substantially to zero.

A major problem in direct current variable gain systems is the tendency for the gain control signal to be converted to a spurious output signal. The present application describes a circuit configuration characterized by a particularly effective isolation of the gain control circuit from the output circuit.

Accordingly, it is a primary object of the present invention to provide improved signal amplifying apparatus with variable gain control.

In a preferred embodiment, the gain of a differential amplifier is controlled by applying a common mode gain control signal to a transistor current source in the emitter circuit of the amplifier. The ratio of the collector currents of the amplifier is maintained substantially constant by a negative feedback circuit when the gain of the amplifier is varied. A resistance network is provided in the feedback circuit for preventing the occurrence of a differential voltage at the collector electrodes when the collector currents vary with variations in gain. Means including the feedback circuit are provided to isolate the differential amplifier from a second cascade connected differential amplifier.

The foregoing and other objects, features and advantages of the invention will be apparent from the following more particular description of a preferred embodiment of the invention, as illustrated in the accompanying drawing.

The preferred embodiment of the improved amplifier includes a first differential amplifying section 1 into which a variable gain control signal is fed; a second isolating section 2 which provides a high common mode negative feedback into the amplifier section 1; and a fixed gain differential amplifier output section 3 which is controlled in accordance with the differential output of section 1.

Section 1 includes a differential amplifier 10 comprising a pair of transistors 11 and 12, the emitter electrodes of which are connected to a negative source potential by way of a current source including a transistor 13 and a resistor 14. The current supplied to the transistor amplifiers 11 and 12 by the transistor 13 is controlled in accordance with voltage-dividing bias-network resistors 15 and 16 and automatic gain control signals applied to the base input terminal 17.

The base electrodes of the transistor amplifiers 11 and 12 are connected to ground potential by way of resistors 18 and 19. The input signals, which are to be amplified, are applied to the base electrode of the transistor amplifier 11 by way of input terminals 20 and 21 and resistors 22, 23, and 24. The junction between the resistors 22, 23 and resistor 24 is connected to ground potential by way of a resistor 25 and a capacitor 26.

The collector electrodes of the transistor amplifiers 11 and 12 are connected to a junction 30 by means of resistors 31 and 32. The collector electrodes are also connected to a junction 33 by way of resistors 34 and 35 and coupling resistors 36 and 37. A pair of capacitors 38 and 39 are connected across the resistors 36 and 37.

The balanced junctions 30 and 33 form inputs to the isolating section 2, said junctions being connected to the base electrodes of a pair of differential amplifier transistors 45 and 46. A resistor 47 and a capacitor 48 are connected across the base electrodes of the latter transistors. Their emitter electrodes are connected to a negative source of potential by means of a resistor 49. Their collector electrodes are connected to a source of positive potential by way of resistors 50 and 51.

The collector electrodes of the transistors 45 and 46 are connected directly to the base electrodes of a second pair of differential amplifier transistors 52 and 53. The emitter electrodes of the transistors 52 and 53 are connected to a negative source of potential by way of a resistor 54. The collector electrodes of the transistors 52 and 53 are returned to a positive source of operating potential by way of resistors 55 and 56.

The collector electrode of the transistor 53 is connected directly to the base electrode of a transistor amplifier 57. A voltage divider comprising a pair of resistors 58 and 59 is connected between the ground potential and a positive source of potential; and the junction between the resistors is connected to the emitter electrode of the transistor 57 to establish the bias level of the emitter electrode. The collector electrode of the transistor 57 is connected to the collector electrodes of the difference amplifiers 11 and 12 by way of a potentiometer 60 and resistors 61 and 62.

As will be described in greater detail below, the potentiometer 60 is set so that the resistors 61 and 62 and the adjacent portions of the resistance of the potentiometer (R1, R2) bear a desired relationship.

The differential output signals from the section 1 are applied to section 3 by way of resistors 36, 37 and capacitors 38, 39, these resistors and capacitors being connected to the base electrodes of a pair of differential amplifying transistors 70 and 71. The emitter electrodes of the latter transistors are connected to a source of positive potential by way of a resistor 72. The collector electrodes are connected to a higher positive source of potential by way of resistors 73 and 74.

The base electrode of the transistor 70 is also connected to the emitter electrode of an output transistor amplifier 75 by way of a feedback resistor 76. The collector electrode of the transistor 70 is coupled to the base electrode of the transistor 75 by way of a parallel connected resistor 77 and capacitor 78. The base electrode of the transistor 75 is connected to a negative source of bias potential by way of a resistor 79. The collector electrode of the transistor 75 is connected to an output terminal 85 by a parallel connected resistor 81 and capacitor 82. The emitter electrode of the transistor 75 is connected to a positive suorce of potential by way of resistors 83 and 84.

The base electrode of the transistor 71 is connected to the emitter electrode of an output transistor amplifier 90 by a feedback resistor 99, the emitter electrode also being connected to a positive source of potential by way of a resistor 91 and the resistor 84. The collector electrode of the transistor 71 is coupled to the base electrode of the transistor 90 by way of a parallel connected resistor 92 and a capacitor 93, the base electrode also being connected to a negative source of potential by way of a resistor 94. The collector electrode of the transistor 90 is connected to an output terminal 95 by way of a parallel connected resistor 96 and a capacitor 97.

The operation of the improved amplifier will now be described in detail.

The potentiometer must be adjusted to provide a zero differential signal at the output terminals 85 and 95.

Assume that the voltage at the base electrode of the transistor 11 is held at zero volts and that the gain of the differential amplifier 10 is increased by virtue of increasing the positive potential on the base electrode of the transistor 13 until the current $I_3$ is fixed at .8 milliampere. The increase in the sum of the collector currents $I_1$ and $I_2$ of transistors 11 and 12 should not be allowed to cause a differential voltage to be developed between the collector electrodes. In this circuit, the two primary causes of a differential voltage occurring will be:

(1) Improper setting of the potentiometer 60 so that $$\frac{R_1}{R_2} \neq \frac{I_2}{I_1}$$

at the gain level at which the potentiometer is set;

(2) The ratio of the collector currents, i.e. $I_1/I_2$, does not stay constant as their sum $I_1+I_2$ is varied.

The first cause of undesired differential voltages is minimized by assuring that the potentiometer adjustment is directed almost exclusively toward achieving the exact condition at which $$\frac{R_1}{R_2} = \frac{I_2}{I_1}$$

for the gain level at which the adjustment is made. The action of section 2, operating with a strong, negative feedback around the resistors 36 and 37, effectively isolates the differential amplifier 10 from the output section 3 on a common mode basis, thus preventing the adjustment of the potentiometer from becoming involved in common mode effects other than those which relate to the amplifier 10. (Were it necessary for common mode current due to the gain control to flow into section 3 through $R_1$ and $R_2$, it would be necessary to establish the ratio $R_1/R_2$ more nearly equal to unity than is the case when the amplifier 10 is isolated from the section 3.)

It will be appreciated, however, that with respect to differential signals, adjustment of the potentiometer corrects for unbalance in both the amplifier 10 and in the differential amplifiers of section 3. That is, the potentiometer is adjusted until no differential output appears across the output terminals 85 and 95.

The second cause of undesired differential voltages at the collector electrodes of the amplifier 10 resulting from changes in gain, i.e. the ratio of $I_1$ to $I_2$ does not remain constant as their sum varies, is due to the fact that the transistors 11 and 12 cannot be perfectly matched. In the preferred embodiment, the transistor pairs in each differential amplifier are preferably matched planar devices which are thermally coupled to maintain substantially the same base-emitter drop and dynamic impedance over a wide temperature and current range and which have approximately equal gains. Any differential signals which appear across the collector electrodes as a result of the close, but different values of gain, and the close, but different base-emitter characteristics, cause spurious output signals which do not exceed tolerable limits. However, maintaining these differential spurious output signals within tolerable limits requires two assumptions which are not strictly true, but which can be maintained within very small tolerances, i.e. (1) the ratio of $I_1$ to $I_2$ is independent of the sum $I_1+I_2$ as the gain is varied, and (2) the section 3 is perfectly balanced.

The collector-base voltage characteristics of transistors is such that the ratio of $I_1$ to $I_2$ can be maintained independent of their sum and substantially constant if the voltage is maintained substantially constant at the collector electrodes of the transistors 11 and 12 as the common mode gain current is varied. As will be described below, section 2 is controlled in such a manner as to maintain the voltages at the collector electrodes of the transistors 11 and 12 substantially constant as the gain is varied. Also as will be seen below, section 3 is designed as to achieve a balance as close as possible to perfect.

The action of section 2, in addition to facilitating accurate setting of the potentiometer, serves the important function of maintaining the collector voltages of the amplifier 10 substantially constant.

Assume the initial condition where the current $I_3$ through the resistor 14 is now eight-tenths milliamperes. For the component values set forth below, this is the current which gives maximum gain and is the point at which the circuit is adjusted to establish common mode balance. Assume that $I_1$ and $I_2$ are respectively .35 and .45 milliampere. Since $$\frac{I_2}{I_1} = \frac{.45}{.35}$$

then $$\frac{R_1}{R_2} = \frac{.45}{.35}$$

The potentiometer is therefore set so that $R_1$=33,000 ohms and $R_2$=25,600 ohms. The common mode voltage which is found at the terminals 30 and 33 is approximately six and seven-tenths volts; and accordingly, the voltage at the wiper at the potentiometer will be $$6.7 \text{ volts} + I_1R_1 \ (.00035 \times 33{,}000) \text{ or } 17.2 \text{ volts}$$

The collector current $I_4$ of the transistor 57 is also eight-tenths milliampere and this collector current splits at the wiper of the potentiometer 60 in the exact ratio of the collector currents $I_1$ and $I_2$.

The voltage levels (6.7 volts) at terminals 33 is determined by the base electrode voltages of the transistors 70 and 71. These latter voltages are established by way of the positive source of potential connected to the resistor 72 and the voltage drops across the resistor 72 and the base-emitter junctions.

The action of section 2 in establishing common mode balance fixes the terminal 30 at the same potential level as terminal 33, thereby reducing common mode current flow through the resistors 36 and 37 substantially to zero. This effectively open circuits or isolates the common mode connection between sections 1 and 3.

Now assume that the gain is cut by a factor of 4, reducing the current $I_3$ to the preferred lower limit, two-tenths milliampere. The currents $I_1$ and $I_2$ decrease and the common mode voltages at the collector electrodes of the transistors 11 and 12 tend to go more negative. However, the current $I_4$ is still at the eight-tenths milliampere level; and, since the excess current cannot flow through the transistors 11, 12 and 13, it tends to flow through resistors 36 and 37 to make the level at terminal 33 more negative than that at terminal 30. The voltage levels at terminals 30 and 33 cause the transistor 46 to conduct more heavily; transistor 53, less heavily; and transistor 57 to reduce its collector current $I_4$ to .2 milliampere. The lower collector current level of $I_4$ tends to maintain the voltage levels at terminals 30 and 33 and at the collector electrodes of transistors 11 and 12 constant and to reduce current flow through the resistors 36 and 37 to zero.

If the ratio of the collector currents $I_1$ and $I_2$ have not varied as a result of this change, then 87 microamperes flows through $R_2$ and 113 microamperes flows through $R_1$. The voltage drop across $R_1$ is still equal to the drop across $R_2$; and, in the absence of an input signal at terminals 20 and 21, there will be no differential voltage at the collectors of amplifier 10. The common mode voltages at terminals 30 and 33 are still both about 6.7 volts with their difference having varied only by the small amount necessary to stimulate section 2 into varying the wiper current of the potentiometer 60 from .8 milliampere to .2 milliampere.

Any tendency for gain control common mode current to flow in either direction through the resistors 36 and 37 changes the voltage at the terminal 33; and negative feedback from section 2 changes the voltage at the input ends of the resistors to prevent such current flow. Since no common mode current flows in resistors 36 and 37, sections 1 and 3 are completely isolated. In a similar manner, section 2 assures that common mode changes in section 3 do not cause current flow into section 1 by way of resistors 36 and 37; and, the potentiometer 60 is therefore isolated from section 3 on a common mode basis to facilitate more accurate setting to maintain the collector voltages of the transistors 11 and 12 constant.

Description of the propagation of signals through the amplifier where the gain is assured to be fixed over short periods of time will now be described. Let us assume that the voltage at the base electrode of the transistor 11 goes negative. As a result, the collector current $I_1$ will decrease and the collector current $I_2$ will increase by equal amounts. This differential current will flow almost exclusively through resistor 36 in parallel with capacitor 38 and through resistor 37 parallel with capacitor 39. The differential current thus arrives at the base electrodes of transistors 70 and 71 which are the feedback points for a double-ended, differential second-emitter-to-first-base feedback amplifier.

Due to the second emitter to first base action, the differential currents arriving at the base electrodes of the transistors 70 and 71 flow primarily through the resistors 76 and 99, while the base electrode voltages of the transistors 70 and 71 remain substantially constant. The resultant differential voltage between the emitter electrodes of the transistors 75 and 90 is amplified and appears at the collector electrodes as the final differential output voltage of the amplifier in response to the input signal.

If desired, conventional common mode feedback means (not shown) can be provided between the collector and emitter circuits of the transistors 75 and 90.

The propagation of input signals through the amplifier 10 and section 3 does not have any effect on conditions in section 2 because these changes are differential and will not produce additional differences between the common mode voltages at terminals 30 and 33; that is, if the collector electrode of the transistor 11 goes positive, the collector of the transistor 12 goes negative by exactly the same amount, and terminals 30 and 33, which are midway between these two collector voltages, will not experience any change.

It will be appreciated that the present circuit obtains substantially improved results even if the base electrode of the transistor 45 is connected to a fixed potential, in which case the level at terminal 30 alone controls section 2. However, the feature of the strong feedback around resistors 36 and 37 is not as effective.

Also, a small portion of the gain control signal at terminal 17 can be coupled to the transistor 57 to speed up the initial portion of the corrective action taken by section 2.

Component values of one embodiment operable with a variation in the gain current $I_3$ between .8 and .2 milliampere with input signals less than twenty millivolts, are set forth below by way of example; however, it will be appreciated that the invention is to be limited only by the scope of the appended claims.

Resistors:

| | Ohms |
|---|---|
| 14, 36, 37, 58 | 3,000 |
| 15, 16 | 20,000 |
| 18, 19 | 16 |
| 22, 23 | 680 |
| 24 | 160 |
| 25 | 1,800 |
| 31, 32, 34, 35 | 49,900 |
| 47 | 1,500 |
| 49 | 600,000 |
| 50, 51 | 18,000 |
| 54 | 130,000 |
| 55, 56 | 15,000 |
| 59 | 82,000 |
| 60 (potentiometer), 76, 99 | 10,000 |
| 61, 62 | 24,300 |
| 72 | 620 |
| 73, 74 | 100,000 |
| 77, 92 | 56,000 |
| 79, 94 | 360,000 |
| 81, 96 | 1,620 |
| 83, 91 | 523 |
| 84 | 6,200 |

Capacitors:

| | |
|---|---|
| 26 | mf__ .015 |
| 38, 39 | mf__ .0091 |
| 48 | mf__ .091 |
| 78, 93 | mf__ .0011 |
| 82, 97 | pf__ 100 |

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In a variable gain amplifier of the type in which a first pair of transistors having base, emitter and collector electrodes are operated as a first differential amplifier to amplify input signals applied to at least one of the base electrodes, in which a balanced differential amplifier has inputs coupled to respective collector electrodes of the first pair of transistors to further amplify the differential input signals, and in which the gain of the first differential amplifier is varied by varying the current supplied to the juncture point of its emitter electrodes, the combination therewith of means isolating the first differential amplifier from the second differential amplifier comprising a first pair of equal valued resistors each coupling a collector electrode to a respective input of the balanced amplifier, a second pair of series connected equal valued resistors connected between those ends of the first resistors which are coupled to the collector electrodes, a third pair of series connected equal valued resistors connected between the opposite ends of the first resistors, and control means including an active device current source having an output circuit and an input circuit, a pair of resistance means each connecting the current source output circuit to a respective one of said collector electrodes, the values of said resistance means having a ratio which is inversely proportional to the ratios of the collector currents of the first differential amplifier which flow from said current source through the resistance means, and including a second differential amplifier having a first input coupled to the junction between the resistors of the second pair and a second input coupled to the junction between the resistors of the third pair and having an output coupled to the input circuit of the current source and responsive to variations in the gain level of the first differential amplifier for causing the current source to produce a common mode feedback for reducing common mode current flow through the first resistor pair substantially to zero.

2. A variable gain amplifier comprising first and second matched transistors having base, emitter and collector electrodes operated as a differential amplifier to amplify input signals applied to at least one of the base electrodes, first and second voltage supply terminals, amplifier means connected between the juncture of the emitter electrodes and one of the terminals for supplying a selected level of common mode current to the emitter electrodes and responsive to input bias current for varying the level of the common mode current supplied to the emitter electrodes to vary the gain of the differential amplifier, an active device current source connected between the juncture of the collector electrodes and the other terminal, and including an input circuit, first and second resistance means interposed between one end of the current source and the collector electrodes of the first and second transistors respectively, the ratio of the values of the first and second resistance means being inversely proportional to the collector current flowing therethrough when the transistors are operated at a predetermined gain level, and additional amplifier means having its input coupled to the collector electrodes and its output coupled to the input circuit of the current source and responsive to variations in the gain level for causing the current source to produce a common mode feedback current which maintains the ratio of the collector currents constant as the gain is varied.

3. A variable gain amplifier comprising first and second matched transistors having base, emitter and collector electrodes operated as a differential amplifier to amplify input signals applied to at least one of the base electrodes, amplifier means connected to the juncture of the emitter electrodes for supplying a selected level of common mode current to the emitter electrodes, means for varying the level of the common mode current supplied by the amplifier means to the emitter electrodes to vary the gain of the differential amplifier, an active device current source for the collector electrodes having an output circuit and an input circuit, first and second resistance means connecting the output circuit of the current source to the collector electrodes of the first and second transistors respectively, the ratio of the values of the first and second resistance means being inversely proportional to the collector current flowing therethrough when the transistors are operated at a predetermined gain level, a pair of balanced output terminals, a first pair of equal valued resistors each connecting a respective collector electrode to a respective output terminal, a second pair of equal valued resistors connected in series across the collector electrodes, a third pair of equal valued resistors connected in series across the output terminals, and means including a second differential amplifier having inputs coupled to the junction between the resistors of the second resistor pair and the junction between the resistors of the third resistor pair, having an output coupled to the input circuit of the current source and responsive to variations in the gain level for causing the current source to produce a common mode feedback which tends to maintain the collector voltages constant, thereby minimizing variations in the ratio of the collector currents and reduces common mode current in the first resistor pair substantially to zero as the gain is varied.

References Cited

UNITED STATES PATENTS

| | | | |
|---|---|---|---|
| 3,046,487 | 7/1962 | Matzen et al. | 330—19 |
| 3,370,242 | 2/1968 | Offner | 330—30 X |

FOREIGN PATENTS

| | | |
|---|---|---|
| 1,003,319 | 9/1965 | Great Britain. |
| 1,154,520 | 9/1963 | Germany. |

NATHAN KAUFMAN, *Primary Examiner.*

U.S. Cl. X.R.

330—69